United States Patent [19]

Wright et al.

[11] 4,134,140

[45] Jan. 9, 1979

[54] VOLTAGE MODE AMPLIFIER FOR USE WITH A HIGH Q MAGNETIC HEAD

[75] Inventors: Charles E. Wright, Escondido; Ward M. Calaway, Sierra Madre, both of Calif.

[73] Assignee: Eastman Technology, Inc., Rochester, N.Y.

[21] Appl. No.: 729,506

[22] Filed: Oct. 1, 1976

[51] Int. Cl.² ........................... G11B 5/02; G11B 5/45
[52] U.S. Cl. ........................................ 360/67; 360/65
[58] Field of Search ................................ 360/65, 67

[56] References Cited

U.S. PATENT DOCUMENTS

| | | | |
|---|---|---|---|
| 2,697,756 | 12/1954 | Bessire | 360/67 |
| 3,026,380 | 3/1962 | Reher et al. | 360/67 |
| 3,048,664 | 8/1962 | Drukey | 360/65 |
| 3,068,327 | 12/1962 | Davidson | 360/67 |
| 3,160,824 | 12/1964 | Stair | 360/67 |
| 3,310,637 | 3/1967 | Skov | 360/65 |
| 3,513,267 | 5/1970 | Trost | 360/67 |
| 4,041,538 | 8/1977 | Parker | 360/67 |

OTHER PUBLICATIONS

Electronic Designer's Handbook by Landee et al., Sec. 18.1 & 18.2, McGraw-Hill Book Co., Inc. ©1957.

Primary Examiner—Vincent P. Canney
Attorney, Agent, or Firm—Robert F. Cody

[57] ABSTRACT

A high Q magnetic playback head applies its developed signal to the input of a voltage mode circuit. To facilitate equalizer design, the head is resistor-damped. While mere resistor damping reduces the Q of the head, it does so at the expense of the signal-to-noise ratio (SNR) of the head-and-amplifier circuit. To maintain SNR substantially without change, the amplifier employs a large resistance to which negative feedback is applied so the resistance appears as an effective resistance equal to its actual value divided by the amplifier gain. The value of this effective resistance is made to equal the magnetic playback head inductive reactance at the point of resonance, thereby reducing the head Q to approximately 1, and equalizer design is made easier.

7 Claims, 4 Drawing Figures

VOLTAGE MODE AMPLIFIER FOR USE WITH A HIGH Q MAGNETIC HEAD

BACKGROUND OF THE INVENTION

1. Field of the Invention

This invention relates in general to amplifier designs and, in particular, to an amplifier design which is useful with a high Q magnetic head.

2. Description Relative to the Prior Art

In the playback of signals from magnetic tape, either of two general types of playback circuits may be employed, to wit, a current mode circuit or a voltage mode circuit:

A current mode circuit is one in which the current produced by a magnetic head is virtually flat as a function of frequency. That is, as the frequency of a playback signal increases, thereby causing the voltage produced by the head coil to rise, so too does the inductive reactance of the coil, resulting in the current being flat with frequency. At low frequencies, because the voltage induced in the head coil is extremely low, the current will be limited by the resistance of the head coil winding. To counter the fall-off of current at low frequencies, the head coil resistance is made as low as possible, typically by using relatively heavy-gauge coil wire. Attendantly, this means larger head structure, and diminished performance with respect to high frequencies, caused by wire skin effects and leakage. Current mode circuits employ low input impedances.

A voltage mode circuit, on the other hand, employs a high input impedance and results in the playback signal from a magnetic playback head having a response that increases with frequency, i.e. is $d\phi/dt$ dependent, where $\phi$ is the magnetic flux in the head core.

In the design of a magnetic playback head, it is customary to place as many turns on the head as possible without causing the resonant frequency of the head to fall within the passband of the range of frequencies to be handled by the head. For example, if the bandedge of interest is 3 MHz, the turns on the head, as designed, will be such that the resonant point will fall above 3 MHz. If the resonant point were to fall below 3 MHz, the number of turns typically would be decreased to raise the resonant point above 3 MHz, thereby sacrificing signal output, but avoiding the voltage peaking that would occur at resonance.

Since, in a voltage mode usage for a playback head, the signal output is $d\phi/dt$ dependent, an equalizer circuit is usually employed to flatten the voltage versus frequency response curve. Ordinarily, for most prior art heads, the job of the equalizer is not stringent. That is, a typical prior art playback head has a Q of about 1 and, thus, its peaking at resonance is minimal, and easily compensated for by an equalizer.

The present trend in the playback of magnetically recorded signals is to use relatively high Q heads, such as ferrite heads. While such heads are highly efficient, and exhibit little change in inductance with frequency, i.e. head output voltage increases extremely linearly with frequency, they do exhibit fairly sharp peaking at their points of resonance. Since the inductance of, say, a ferrite head can vary within 20 percent of a manufacturer's target for inductance, resonance for a ferrite head may fall below the upper bandedge of interest. This, coupled with the fact that inductance-change (decrease), resulting from head gap-depth decreasing as a result of head wear, means that the job of the aforementioned equalizer is extremely difficult to implement.

(To be noted is that, whereas the concept of U.S. Pat. No. 3,310,637 is directed to use of resonance peaking well within the passband of interest — and current mode operates as per its FIG. 5 — the present invention primarily concerns the use of resonance outside the passband of interest but, as will appear below, provides, among other things, toleration for shifting of the resonance point to within the passband of interest.)

To nullify the effect of sharp peaking at resonance in a high Q head, thereby facilitating equalizer design, it would appear that a resistance, equal to about the inductive reactance of the head coil at resonance and placed in parallel with the head coil, would lower the Q of the head. That way, at low frequencies, the resistance would not load the head; and at high frequencies, i.e. those near resonance, head response damping would be effected, as desired. Indeed, since $$Q = \frac{R_P \text{ (i.e. parallel impedance of the head coil at resonance)}}{X_L \text{ (inductive reactance of the head coil at resonance)}},$$

See, for example, Electronic and Radio Engineering, Frederick E. Terman, page 52, e.g. 3-17, McGraw Hill Book Co., NY, 1955) as a shunt resistance is placed across the head, the resulting $R_P$ (i.e. the parallel combination of $R_P$ and the shunt resistance) equals $X_L$, thereby causing $Q = R_P/X_L$ to equal 1. Such a tack however, while working well to damp response at resonance, causes the head SNR to degenerate appreciably. This is because a resistor, in parallel with the head coil, and equal to $X_L$ at resonance, causes the signal to decrease in proportion to the value of the resistor whereas the noise decreases in proportion to the square root of the resistor.

SUMMARY OF THE INVENTION

In practicing the invention, a Q-reducing shunt resistance is placed across a high Q playback head in a voltage mode circuit; but, rather than merely employ a low value resistance in the circuit, the invention proposes the use of a high value of resistance, whereby SNR is not significantly reduced. However, by use of negative feedback, the high value of resistance is made to appear significantly lower in value, and equal to the inductive reactance of the head at resonance. To this end, the gain of the amplifier is employed to divide effectively the value of the shunt resistance in a manner to be described in connection with the figures, of which:

Figure 1A:
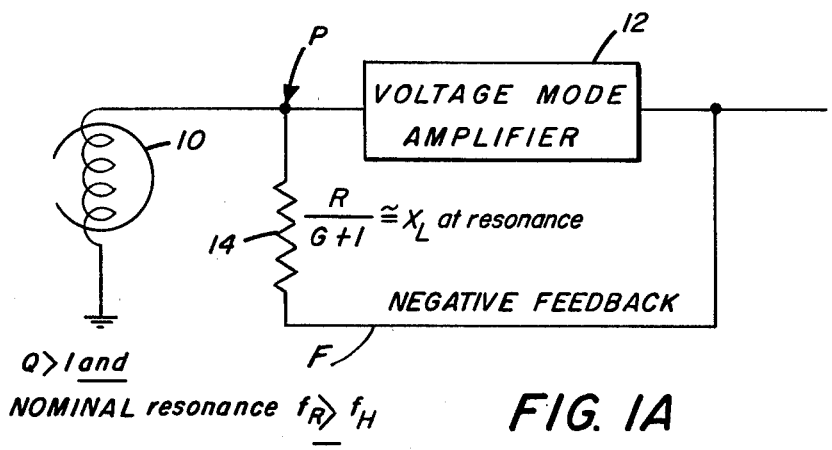
FIG. 1a is a schematic block diagram of apparatus according to the invention.
Figure 1B:
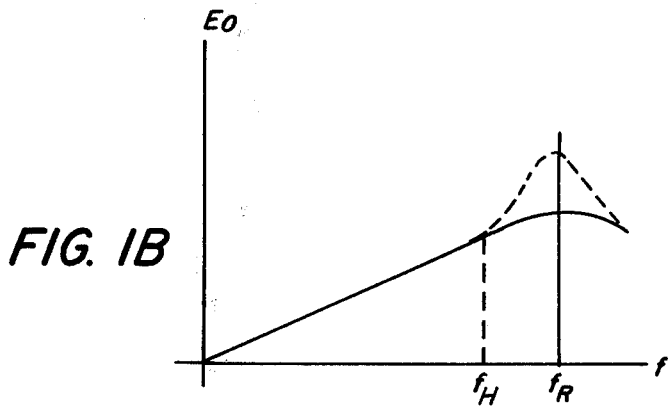
FIG. 1b is a response curve useful in describing the invention.

Referring to FIGS. 1a and 1b, a high Q magnetic playback head 10, such as a ferrite head, applies its induced signal to a voltage mode amplifier 12, characteristically having high input impedance. The frequency passband of interest for the circuit of FIG. 1a is up to, but below, the frequency $f_H$ (FIG. 1b), which is below the resonant frequency $f_R$ of the head 10. A resistor 14, one end of which is connected to the amplifier 12 output, and the other end of which is connected to the head coil has a resistance value R, but appears in an ac equivalent circuit as a resistance equal to (R/G+1) in parallel with the head coil, where G is the gain of the circuit 12. That the effective resistance is (R/G+1), and not R, may be seen from the following analysis: Assuming a gain of 10, and an input signal level of 1 volt applied to the amplifier 12, i.e. at the point P of FIG. 1a, the voltage applied to point F of the resistor 14 would be −10 volts, resulting in an 11v potential across resistor 14, and causing the resistor 14 to draw more current . . . which is to say that its effective resistance decreased. By making (R/G+1) in parallel with $R_p$ equal to $X_L$ at resonance, the resultant Q would equal 1.

$$Q = \frac{R_p(\frac{R}{G+1})}{X_L(R_p + \frac{R}{G+1})} = 1$$

What this means is this: Although the Q of the head 10, taken alone, is high (dashed line, FIG. 1b) — manifesting sharp peaking at $f_R$ — the Q of the head when in the circuit is only 1. Thus, the response curve for the head circuit is as shown by the solid line of FIG. 1b and, attendantly, equalization of the response is relatively easy to obtain without sacrificing SNR.

Figure 2:
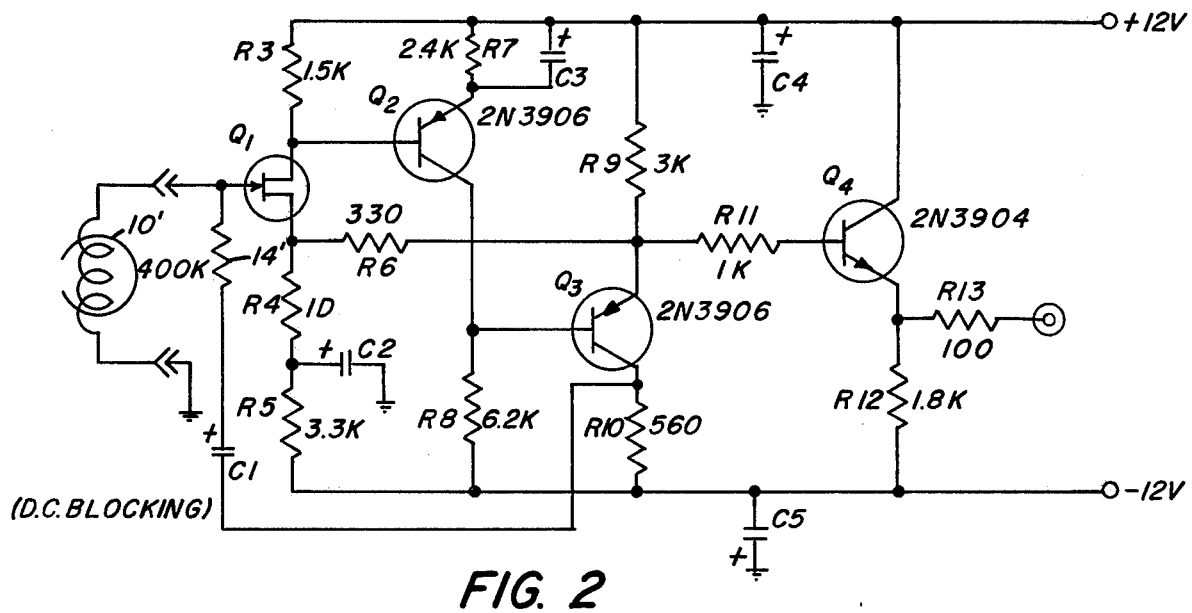
FIG. 2 is a schematic diagram of a presently preferred form of the invention.

Reference should now be had to FIG. 2 for a presently preferred implementation of the invention depicted in FIG. 1a. A magnetic playback head 10' (corresponding parts on the circuits of FIGS. 1a and 2 are identified by the use of primes) applies its output signal to a common source N-channel, field effect transistor Q1. The output of the transistor Q1 is amplified by transistors Q2 and Q3, the approximate gain at the emitter of Q3 being determined by the ratio of the resistance R6 + R4 to R4. The approximate gain to the collector of Q3 equals R10 divided by the resistance of R6 plus R4 taken in parallel with R9 multiplied by the gain at the emitter of Q3. Thus, $$G \simeq \left[\frac{R10(R4 + R6 + R9)}{R9(R4 + R6)}\right]\left(\frac{R4 + R6}{R4}\right) \simeq 62$$

(The above calculation is not exact since it ignores the finite open loop gain to the emitter of $Q_3$, and the emitter resistance of $Q_3$. An exact analysis including these terms gives a gain of approximately 51 at the collector of $Q_3$).

In light of the fact that the head 10' used in the circuit of FIG. 2 has an inductance of 370 μHy, the inductive reactance of the head is 7 kΩ at resonance; and, if the head has a Q, say, of 7, the $R_P$ at resonance of the head 10' in question is 49 kΩ.

A feedback resistor 14', connected to the head 10', has a resistance which preferably is such that, when divided by the "gain + 1" at the collector of $Q_3$ in parallel with $R_p$, as described with reference to FIG. 1a, equals the inductive reactance of the head 10' at resonance. In other words, the resistance of the resistor 14' is selected so that, when divided by 52 (i.e. the "gain + 1" at the collector of $Q_3$), it appears as a resistance equaling the inductive reactance of the head 10' at resonance (400 kΩ divided by 52, in parallel with $R_p$, equals 7.7 kΩ approximately). With $R_p$ at resonance equal to 49 kΩ, such an effective resistance effectively damps the head 10' (Q≈1). But at frequencies below resonance, i.e. when $X_L$ is relatively small, the resistance 14' negligibly loads the head 10'.

Preferably the static resistance 14' should be on the order of 100 × $R_p$ to result in virtually no loss of SNR at resonance. In practice, depending upon head and circuit the ideal is not always obtainable. Therefore, in practice a resistance value of from 5–10 times $R_p$ performs satisfactorily with approximately a 1db loss of SNR at resonance.

At resonance, since $R_p$ equals 49 kΩ, the active resistance 7.7 k, of resistor 14' in parallel with 49 kΩ means that the resultant $R_P$ of $$\frac{49 \, k\Omega \cdot 7.7 \, k\Omega}{49 \, k\Omega + 7.7 \, k\Omega}$$

equals approximately 7 kΩ. Which is to say, the Q of the head at resonance equals 1 (again, Q = $R_P$ resultant divided by $X_L$ at resonance) — a fact which facilitates equalization.

A transistor Q4, used as an emitter follower, receives at its base the amplified head output signal and serves as the circuit output device.

Figure 3:
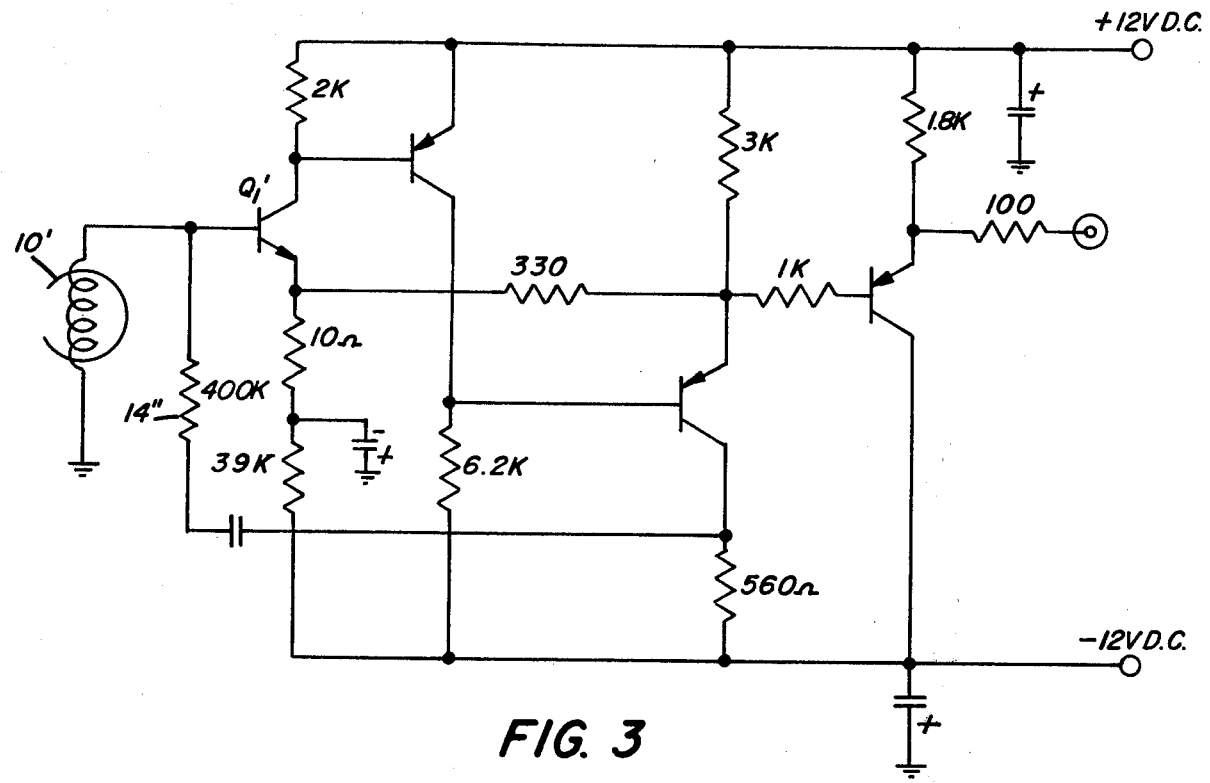
FIG. 3 is a schematic diagram of another embodiment of the invention.

The invention has been described in detail with particular reference to preferred embodiments thereof, but it will be understood that variations and modifications can be effected within the spirit and scope of the invention. For example, the presently described form of the invention employs a field effect transistor as the input device — because it exhibits good high frequency performance — other embodiments of the invention are operable as well. FIG. 3 shows one such circuit employing a bipolar transistor Q1' as the input device, and employing a resistor 14" for head Q damping purposes, such resistor being divided from its 400 kΩ resistance value to approximately the inductive reactance of the head at resonance as similarly provided in the circuits of FIGS. 1a and 2.

What is claimed is:
1. Apparatus for processing a band of frequencies comprising:
   (a) a magnetic head comprising a magnetic core and a coil coupled to said core, said head having a Q in excess of 1;
   (b) a voltage mode amplifier adapted to receive signals induced in said coil, said amplifier including means for providing said amplifier with predetermined gain; and
   (c) negative feedback resistance means connected from the output of said amplifier to the input of said amplifier, said resistance means having a resistance value such that said amplifier means has an input impedance approximately equal to the inductive reactance of said head at resonance; whereby negative feedback serves to reduce the effective resistance of said resistance means and thereby reduce the Q of the head to approximately 1.
2. The apparatus of claim 1 wherein said magnetic head has a nominal resonance frequency above the upper bandedge of said band of frequencies.
3. The apparatus of claim 2 wherein the core of said magnetic head is ferrite, the upper bandedge of said band of frequencies is about 3 MHz, and the nominal resonance of said magnetic head is slightly above 3 MHz.
4. Apparatus for use in the playback of signals recorded on a magnetic medium comprising:

(a) a magnetic head having a ferrite core and a coil inductively coupled thereto, said head having a Q greater than 1;
(b) an amplifier circuit having means providing it with a predetermined gain greater than 1, said amplifier circuit being coupled to receive the signal developed in the coil of said head and said amplifier circuit having a substantially flat response; and
(c) feedback resistor means, coupled from the output of said amplifier circuit to the input of said amplifier circuit, said resistor means having a value of resistance such that said resistor means appears as a resistance approximately equal to its value divided by the gain of said amplifier circuit, thereby lowering the Q of said head without loading said head at frequencies below the resonant frequency of said head.

5. The apparatus of claim 4 wherein the resonance of said head is nominally above a band of frequencies to be processed by said apparatus.

6. The apparatus of claim 4 wherein:
(a) said core is comprised of ferrite material;
(b) wherein said amplifier circuit is adapted to amplify a band of frequencies having an upper frequency bandedge; and
(c) said core has a nominal resonant frequency above said bandedge frequency.

7. Apparatus for processing a band of frequencies comprising:
(a) a magnetic transducer comprising a magnetic core and a coil coupled to said core, said transducer having a Q in excess of 1;
(b) a voltage mode amplifier adapted to receive signals induced in said coil, said amplifier having means for providing said amplifier with predetermined gain; and
(c) negative feedback resistance means connected from the output of said amplifier to the input to said amplifier, said resistance means having a resistance value such that said amplifier has an input impedance approximately equal to the inductive reactance of said head at resonance; whereby negative feedback serves to reduce the effective resistance of said resistance means and thereby reduce the Q of the transducer to approximately 1.

* * * * *